(12) United States Patent
Dhumal et al.

(10) Patent No.: US 8,080,464 B2
(45) Date of Patent: Dec. 20, 2011

(54) METHODS FOR PROCESSING SILICON ON INSULATOR WAFERS

(75) Inventors: Swapnil Y. Dhumal, Brentwood, MO (US); Lawrence P. Flannery, Warrenton, MO (US); Thomas A. Torack, Oakland, MO (US); John A. Pitney, St. Peters, MO (US)

(73) Assignee: MEMC Electronics Materials, Inc,, St. Peters, MS (US)

( * ) Notice: Subject to any disclaimer, the term of this patent is extended or adjusted under 35 U.S.C. 154(b) by 0 days.

(21) Appl. No.: 12/971,788

(22) Filed: Dec. 17, 2010

(65) Prior Publication Data

US 2011/0159668 A1 Jun. 30, 2011

Related U.S. Application Data

(60) Provisional application No. 61/290,787, filed on Dec. 29, 2009.

(51) Int. Cl.
*H01L 21/30* (2006.01)

(52) U.S. Cl. ......... 438/459; 438/406; 438/458; 438/697

(58) Field of Classification Search .................. 438/406, 438/455–459
See application file for complete search history.

(56) References Cited

U.S. PATENT DOCUMENTS

| | | | |
|---|---|---|---|
| 6,287,941 B1 * | 9/2001 | Kang et al. | 438/459 |
| 6,562,720 B2 | 5/2003 | Thilderkvist et al. | |
| 2002/0090818 A1 * | 7/2002 | Thilderkvist et al. | 438/689 |
| 2004/0053515 A1 | 3/2004 | Comita et al. | |
| 2007/0066036 A1 | 3/2007 | Schauer et al. | |
| 2007/0249139 A1 * | 10/2007 | Gadkaree et al. | 438/458 |
| 2007/0259526 A1 * | 11/2007 | Kang et al. | 438/697 |
| 2009/0032873 A1 * | 2/2009 | Cites et al. | 257/347 |

FOREIGN PATENT DOCUMENTS

| | | |
|---|---|---|
| EP | 1855309 A1 | 11/2007 |
| WO | 0063954 A1 | 10/2000 |

OTHER PUBLICATIONS

Habuka, Hitoshi et al., Dominant rate process of silicon surface etching by hydrogen chloride gas, Science Direct, Oct. 1, 2005, pp. 104-110, Elsevier.

Habuka, Hitoshi et al., Nonlinear increase in silicon epitaxial growth rate in a SiHCl3-H2 system under atmospheric pressure, Journal of Crystal Growth, Dec. 1, 1997, pp. 359-362, vol. 182, No. 3-4, Elsevier, Amsterdam, NL.

Habuka, Hitoshi et al., Change in Microroughness of a Silicon Surface during In Situ Cleaning Using HF and HCl Gases, Journal of the Electrochemical Society, Dec. 1, 1998, vol. 145, No. 12, pp. 4264-4271, Electrochemical Society, Manchester, NH.

PCT International Search Report and Written Opinion of the International Searching Authority mailed on Mar. 9, 2011 regarding PCT/US2010/062094 filed on Dec. 23, 2010.

* cited by examiner

*Primary Examiner* — Dung A. Le
(74) *Attorney, Agent, or Firm* — Armstrong Teasdale LLP

(57) ABSTRACT

Methods are provided for etching and/or depositing an epitaxial layer on a silicon-on-insulator structure comprising a handle wafer, a silicon layer, and a dielectric layer between the handle wafer and the silicon layer. The silicon layer has a cleaved surface defining an outer surface of the structure. The cleaved surface of wafer is then etched while controlling a temperature of the reactor such that the etching reaction is kinetically limited. An epitaxial layer is then deposited on the wafer while controlling the temperature of the reactor such that a rate of deposition on the cleaved surface is kinetically limited.

18 Claims, 9 Drawing Sheets

METHODS FOR PROCESSING SILICON ON INSULATOR WAFERS

CROSS-REFERENCE TO RELATED APPLICATION

This application claims priority to U.S. Provisional Application No. 61/290,787 filed Dec. 29, 2009, the entire disclosure of which is hereby incorporated by reference in its entirety.

BACKGROUND

Semiconductor wafers are generally prepared from a single crystal ingot (e.g., a silicon ingot) which is then sliced into individual wafers. While reference will be made herein to semiconductor wafers constructed from silicon, other materials may be used as well, such as germanium or gallium arsenide.

One type of wafer is a silicon-on-insulator (SOI) wafer. An SOI wafer includes a thin layer of silicon atop an insulating layer (i.e., an oxide layer) which is in turn disposed on a silicon substrate. A silicon-on-insulator wafer is a type of silicon-on-insulator structure.

An example process of making an SOI wafer includes depositing a layer of oxide on a polished front surface of a donor wafer. Particles (e.g., hydrogen atoms or a combination of hydrogen and helium atoms) are implanted at a specified depth beneath the front surface of the donor wafer. The implanted particles form a cleave plane in the donor wafer at the specified depth at which they were implanted. The surface of the donor wafer is cleaned to remove material deposited on the wafer during the implantation process.

The front surface of the donor wafer is then bonded to a handle wafer to form a bonded wafer. The donor wafer and handle wafer are bonded together by exposing the surfaces of the wafers to a plasma containing, for example, oxygen or nitrogen. Exposure to the plasma modifies the structure of the surfaces in a process often referred to as surface activation. The wafers are then pressed together and a bond is formed therebetween. This bond is relatively weak, and must be strengthened before further processing can occur.

In some processes, the bond between the donor wafer and handle wafer (i.e., a bonded wafer) is strengthened by heating or annealing the bonded wafer pair at temperatures between approximately 300° C. and 500° C. The elevated temperatures cause the formation of covalent bonds between the adjoining surfaces of the donor wafer and the handle wafer, thus solidifying the bond between the donor wafer and the handle wafer. Concurrently with the heating or annealing of the bonded wafer, the particles earlier implanted in the donor wafer weaken the cleave plane. A portion of the donor wafer is then separated (i.e., cleaved) along the cleave plane from the bonded wafer to form the SOI wafer.

The bonded wafer is first placed in a fixture in which mechanical force is applied perpendicular to the opposing sides of the bonded wafer in order to pull a portion of the donor wafer apart from the bonded wafer. According to some methods, suction cups are used to apply the mechanical force. The separation of the portion of the donor wafer is initiated by applying a mechanical wedge at the edge of the bonded wafer at the cleave plane in order to initiate propagation of a crack along the cleave plane. The mechanical force applied by the suction cups then pulls the portion of the donor wafer from the bonded wafer, thus forming an SOI wafer. According to other methods, the bonded pair may instead be subjected to an elevated temperature over a period of time to separate the portion of the donor wafer from the bonded wafer. Exposure to the elevated temperature causes initiation and propagation of a crack along the cleave plane, thus separating a portion of the donor wafer.

The resulting SOI wafer comprises a thin layer of silicon (the portion of the donor wafer remaining after cleaving) disposed atop the oxide layer and the handle wafer. The cleaved surface of the thin layer of silicon has a rough surface that is ill-suited for end-use applications. The damage to the surface may be the result of the particle implantation and the resultant dislocations in the crystal structure of the silicon. Accordingly, additional processing is required to smooth the cleaved surface.

To smooth and thin the surface layer of silicon (i.e., cleaved surface), previous processes used high-temperature gaseous etching (i.e., epitaxial-smoothing (epi-smoothing)) or the deposition of a thin layer of silicon on the surface layer (i.e., epitaxial-deposition (epi-deposition)). In these previous methods, the etching or deposition is carried out at temperatures where the reaction is transport limited (i.e., the rate of reaction is limited by the availability of fresh reactants). These transport limited reactions result in thickness variations (e.g., sharp gradients in the thickness profile) at the edges of the surface layer of silicon. Further processing is needed to eliminate the thickness variations caused by the previous processes. Previous attempts to reduce the thickness variations at the edges of the surface layer have involved stripping the exposed oxide layer from the handle wafer. However, stripping the oxide layer from the handle wafer is time-consuming and costly and often results in significant bowing or warping of the wafer due to the residual stresses caused by the unexposed portion of the oxide layer.

Thus, there remains an unfulfilled need for a wafer surface treatment method that addresses the disadvantages of current treatment operations and is suitable for use in bonded wafer processing operations.

BRIEF SUMMARY

One aspect is a method for processing a silicon-on-insulator structure comprising a handle wafer, a silicon layer, and a dielectric layer between the handle wafer and the silicon layer. The silicon layer has a cleaved surface defining an outer surface of the structure. The method includes inserting the structure into a reactor. The cleaved surface of the wafer is then etched while controlling a temperature of the reactor such that the etching reaction is kinetically limited. An epitaxial layer is then deposited on the wafer while controlling the temperature of the reactor such that a rate of deposition on the cleaved surface is kinetically limited.

Another aspect is a method for processing a silicon-on-insulator structure comprising a handle wafer, a silicon layer, and a dielectric layer between the handle wafer and the silicon layer. The silicon layer has a cleaved surface defining an outer surface of the structure. The method includes inserting the structure into a reactor. The temperature of the reactor is then set such that a rate of etching of the cleaved surface will be kinetically limited. A flow of gaseous etchant is then initiated into the reactor and the cleaved surface is etched.

Still another aspect is a method for processing a silicon-on-insulator structure comprising a handle wafer, a silicon layer, and a dielectric layer between the handle wafer and the silicon layer. The silicon layer has a cleaved surface defining an outer surface of the structure. The method includes inserting the structure into a reactor. A temperature of the reactor is then set such that a rate of deposition of silicon on the cleaved surface will be kinetically limited. A flow of deposition gas is then initiated into the reactor and silicon is deposited onto the cleaved surface of the structure.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

BRIEF DESCRIPTION OF THE DRAWINGS

The drawings are not to scale and certain features may be exaggerated for ease of illustration.

DETAILED DESCRIPTION

Figure 1A:
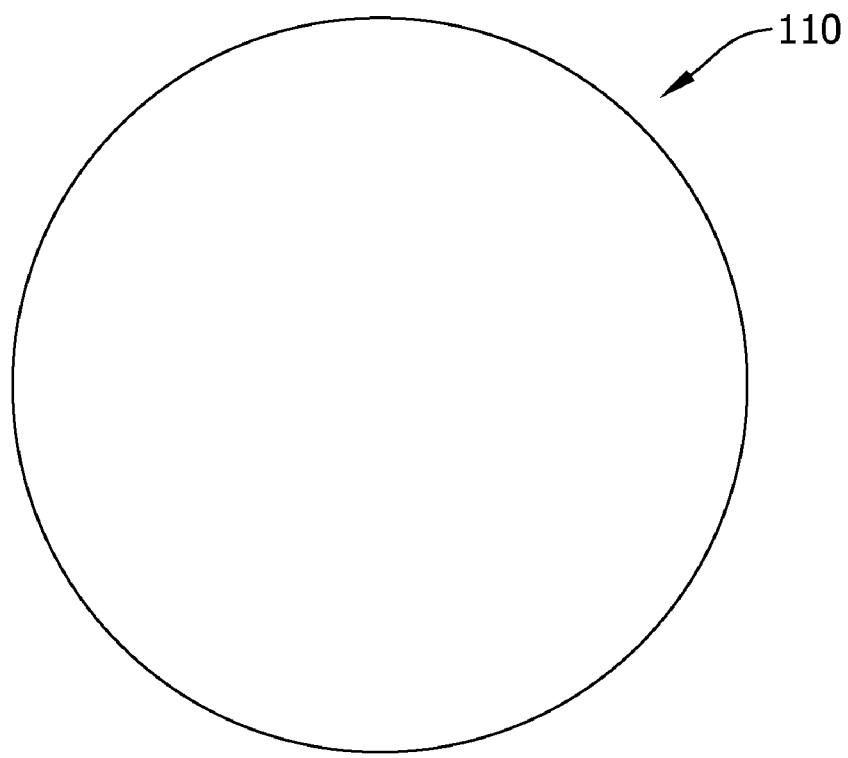
FIG. 1A is a top plan view of a donor silicon wafer.
Figure 1B:
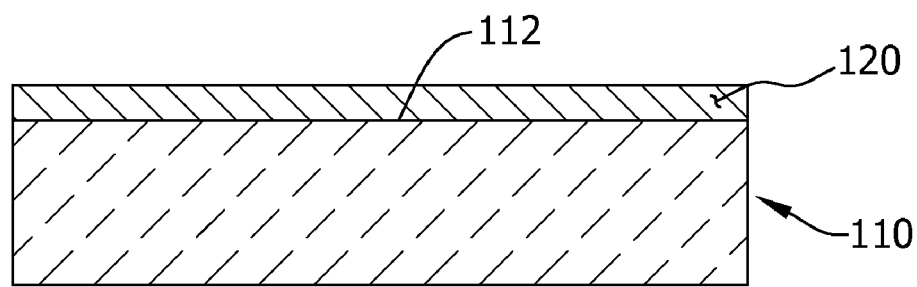
FIG. 1B is a cross-sectional view of the donor silicon wafer of FIG. 1B.

Referring initially to FIGS. 1A and 1B, a donor wafer 110 and an oxide layer 120 are depicted. FIG. 1A is a top plan view of the donor wafer 110, while FIG. 1B is a cross-sectional view of the donor wafer. The oxide layer 120 is bonded to a front surface 112 of the donor wafer 110. The oxide layer 120 can be grown atop the front surface 112 by subjecting the donor wafer 110 to an atmosphere suitable for the growth of the oxide layer. Alternatively, the oxide layer 120 can be deposited on the front surface 112 through any known chemical deposition process and functions as an insulator (i.e., a dielectric).

Figure 2:
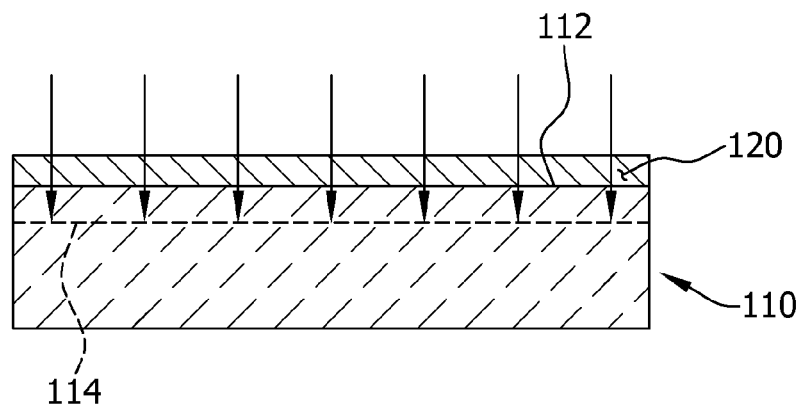
FIG. 2 is a cross-sectional view of the donor silicon wafer undergoing ion implantation.

FIG. 2 is a cross-sectional view of the donor wafer 110 being implanted with particles (e.g., hydrogen atoms or a combination of both hydrogen atoms and helium atoms). The donor wafer 110 is implanted with particles to a specified depth below the front surface 112 of the donor wafer 110. In some embodiments, the particles are hydrogen or helium ions which are implanted through an ion implantation process. A cleave plane 114 is then formed beneath the front surface 112 of the donor wafer 120 at a distance from the front surface equal to specified depth to which the particles were implanted. The cleave plane 114 defines a plane through the donor wafer 110 where the donor wafer is substantially weakened by the implantation of the ions upon subsequent heating of the donor wafer.

Figure 3:
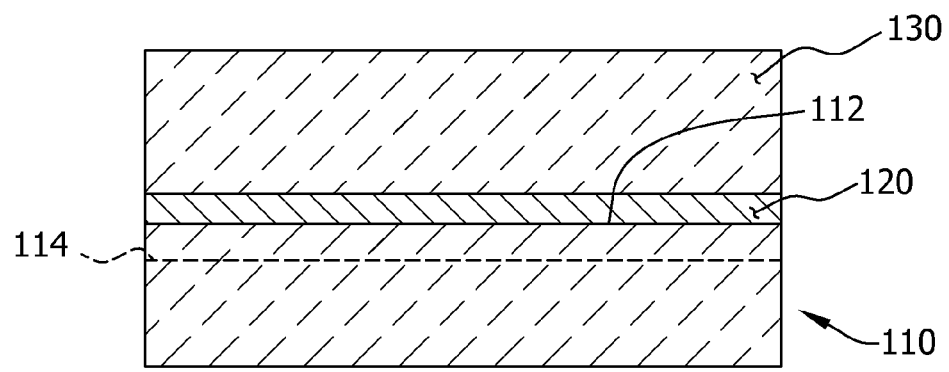
FIG. 3 is a cross-sectional view of a bonded wafer comprising the donor silicon wafer bonded to a handle silicon wafer.
Figure 6:
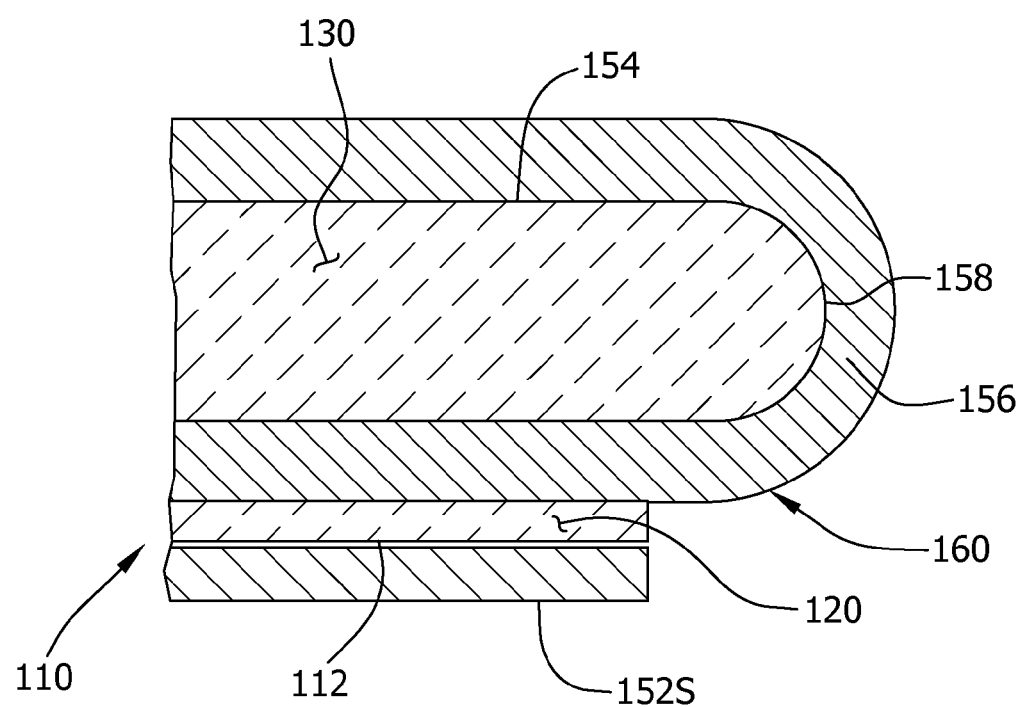
FIG. 6 is an enlarged portion of FIG. 5 with features exaggerated for ease of illustration.

FIG. 3 is a cross-sectional view of the donor wafer 110 and a handle wafer 130. The donor wafer 110 and handle wafer 130 are bonded together in accordance with any suitable method, such as a hydrophilic bond. The donor wafer 110 and handle wafer 130 are bonded together by exposing the surfaces of the wafers to plasma containing, for example, oxygen or nitrogen. The surfaces of the wafers 110, 130 are modified by the exposure to the plasma in a process often referred to as surface activation. The wafers 110, 130 are then pressed together and a bond is formed therebetween. This bond is weak, and must be strengthened before further processing can occur. In some embodiments, the handle wafer 130 is covered by a thin layer of oxide 156, as best seen in FIG. 6. The oxide layer 156 can be grown atop the handle wafer 130 by subjecting the handle wafer to an atmosphere suitable for the growth of the oxide layer.

Together, the donor wafer 110 and handle wafer 130 form a bonded wafer 140. In some processes, the hydrophilic bond between the donor wafer and handle wafer (i.e., a bonded wafer) is strengthened by heating or annealing the bonded wafer pair at temperatures between approximately 300° C. and 500° C. The elevated temperatures cause formation of covalent bonds between the adjoining surfaces of the donor wafer and the handle wafer, thus solidifying the bond between the donor wafer and the handle wafer. Concurrently with the heating or annealing of the bonded wafer, the particles earlier implanted in the donor wafer begin to move and weaken the cleave plane.

Figure 4:
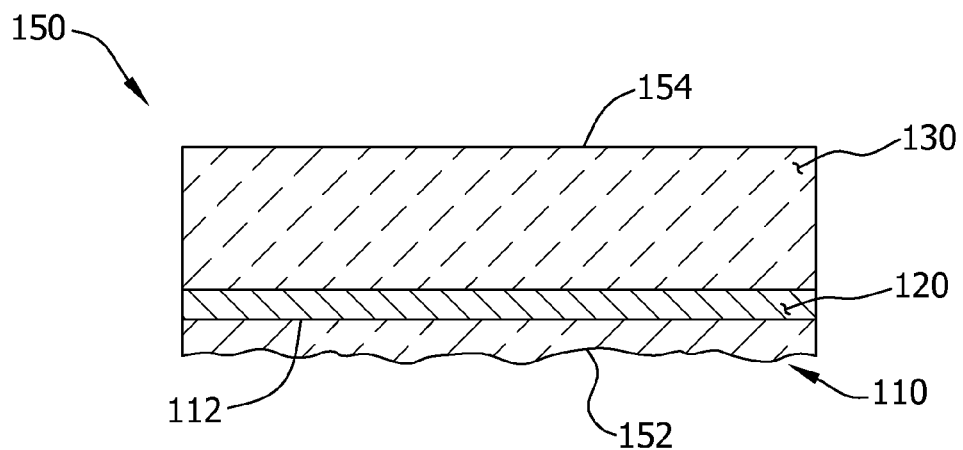
FIG. 4 is a cross-sectional view of the bonded wafer of FIG. 3 after a portion of the donor wafer has been removed.

FIG. 4 is a cross-sectional view of the bonded wafer 140 depicted in FIG. 3. A portion of the bonded wafer 140 has been removed during a cleaving process, resulting in the creation of a silicon-on-insulator (SOI) wafer, referred to generally as 150. According to other methods, the bonded pair may instead be subjected to an elevated temperature over a period of time to separate the portion of the donor wafer from the bonded wafer. Exposure to the elevated temperature functions to initiate and propagate a crack along the cleave plane, thus separating a portion of the donor wafer.

Because the cleave plane 114 has been substantially weakened by the implantation of ions, it defines a boundary along which the wafer readily separates when a force is applied thereto. According to some embodiments, the bonded wafer 140 is first placed in a fixture in which mechanical force is applied perpendicular to the opposing sides of the bonded wafer in order to pull the portion of the donor wafer apart from the bonded wafer. In one embodiment, suction cups are used to apply the mechanical force. The separation of the portion of the donor wafer 110 is initiated by applying a mechanical wedge at the edge of the bonded wafer at the cleave plane in order to initiate propagation of a crack along the cleave plane. Due to the weakened structure of the cleave plane, the crack propagates along the cleave plane 114 until the bonded 140 wafer has separated into two pieces along the cleave plane. The mechanical force applied by the suction cups then pulls the bonded wafer 140 into two pieces. One piece is comprised only of a portion of the donor wafer 110. The other piece is comprised of the handle wafer 130 and the portion of the donor wafer 110 bonded thereto and forms the SOI wafer 150.

A cleaved surface 152 of the SOI wafer 150 defines the surface which results after the separation of the bonded wafer 140 along the cleave plane 114. The cleaved surface 152 has a damaged surface as a result of the separation along the cleave plane 114. Without further processing, the damage renders the surface ill-suited for end-use applications. Accordingly, the cleaved surface 152 is subjected to additional processing steps to repair the damage and smooth the cleaved surface 152.

Figure 5:
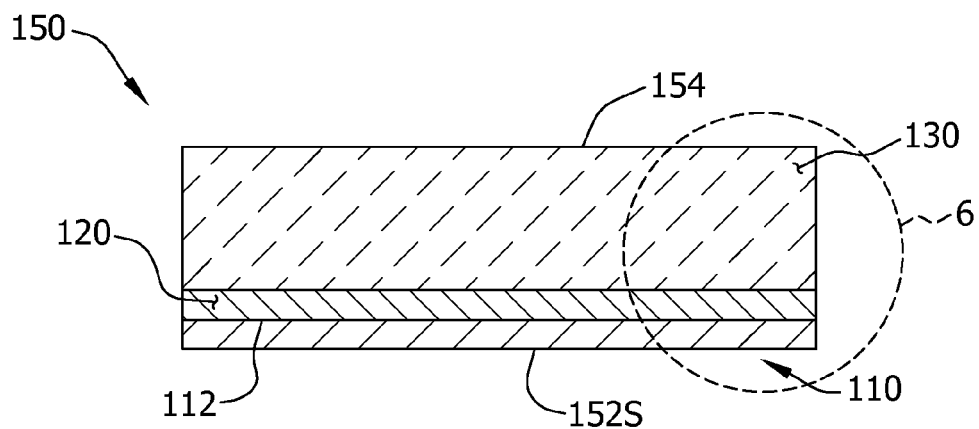
FIG. 5 is a cross-sectional view of the bonded wafer of FIG. 4 after processing of a cleaved surface of the bonded wafer.

FIG. 5 is a cross-sectional view of the SOI wafer 150 after processing of the cleaved surface 152, resulting in a smoothed cleaved surface 152S. As can be seen in FIG. 5, the smoothed cleaved surface 152S has a smooth surface with a uniform profile. The processing of the SOI wafer 150 is discussed in greater detail in relation to FIGS. 7-9, below.

FIG. 6 shows an enlarged portion of FIG. 5 with greatly exaggerated proportions. The relative thicknesses of an oxide layer 156 on the handle wafer 130, the oxide layer 120, and the smoothed cleaved surface 152S are greatly exaggerated for the sake of clarity. Moreover, the width of a terrace region 160 is exaggerated as well. As shown in FIG. 6, the smoothed cleaved surface 152S and the oxide layer 120 do not extend over the entirety of the oxide layer 156 of the handle wafer 130. Instead, the smoothed cleaved surface 152S and adjacent oxide layer 120 terminate radially inward from a circumferential edge 158 of the handle wafer 130, leaving the terrace region 160, and the oxide layer 156, exposed. The oxide layer 156 surrounds the handle wafer 130 and thus extends radially outward from the circumferential edge 158 thereof. The terrace region 160 thus includes the portion of the oxide layer 156 adjacent and surrounding the circumferential edge 158 of the handle wafer 130. The width of the terrace region 160 in some embodiments may be twice the thickness of the handle wafer 130.

As discussed above, previous systems use epi-smoothing and epi-deposition processes at elevated temperatures to create the smooth, cleaved surface 152S shown in FIG. 5. These processes are carried out in previous systems at temperatures where the rate of the respective chemical reactions of the processes are transport limited. That is, the rate of the chemical reaction is limited by the availability of fresh reactants, as opposed to a kinetically limited reaction where the rate of reaction is limited only by the kinetics of the chemical reaction.

It is believed that the transport limitation of the processes results in sharp gradients in the thickness of the smoothed surface 152S adjacent the circumferential edge 158 of the handle wafer 130. In some processes, the sharp gradients in the thickness of the smoothed surface 152S extend from 5 mm to 10 mm inward from the edge of the handle wafer 130.

As the reactants of the epi-smoothing or epi-deposition processes come into contact with the edge of the smoothed surface 152S adjacent the oxide layer 156 near the circumferential edge 158 of the handle wafer 130, the rate of reaction increases because of the absence of material adjacent the edge. Moreover, the reactants of the epi-smoothing or epi-deposition processes do not react with the oxide layer 156 in the terrace region. Thus the rate of reaction increases at the edges because there are a greater quantity of reactants available when compared to those available for other regions of the smoothed surface 152S disposed inward of the circumferential edge 158. Additionally, the increased rate of reaction on the smoothed surface 152S near the terrace region is also caused by the boundary layer theory and/or lateral diffusion of the reactants from the terrace region.

Accordingly, in epi-deposition processes this increased rate of reaction at or near the circumferential edge 158 results in the increased deposition of silicon and corresponding increased thickness of the smoothed surface 152S adjacent the circumferential edge. In epi-smoothing operations, this increased rate of reaction results in an increased amount of silicon etched from the surface and a corresponding decreased thickness of the smoothed surface 152S adjacent the circumferential edge 158.

Figure 7:
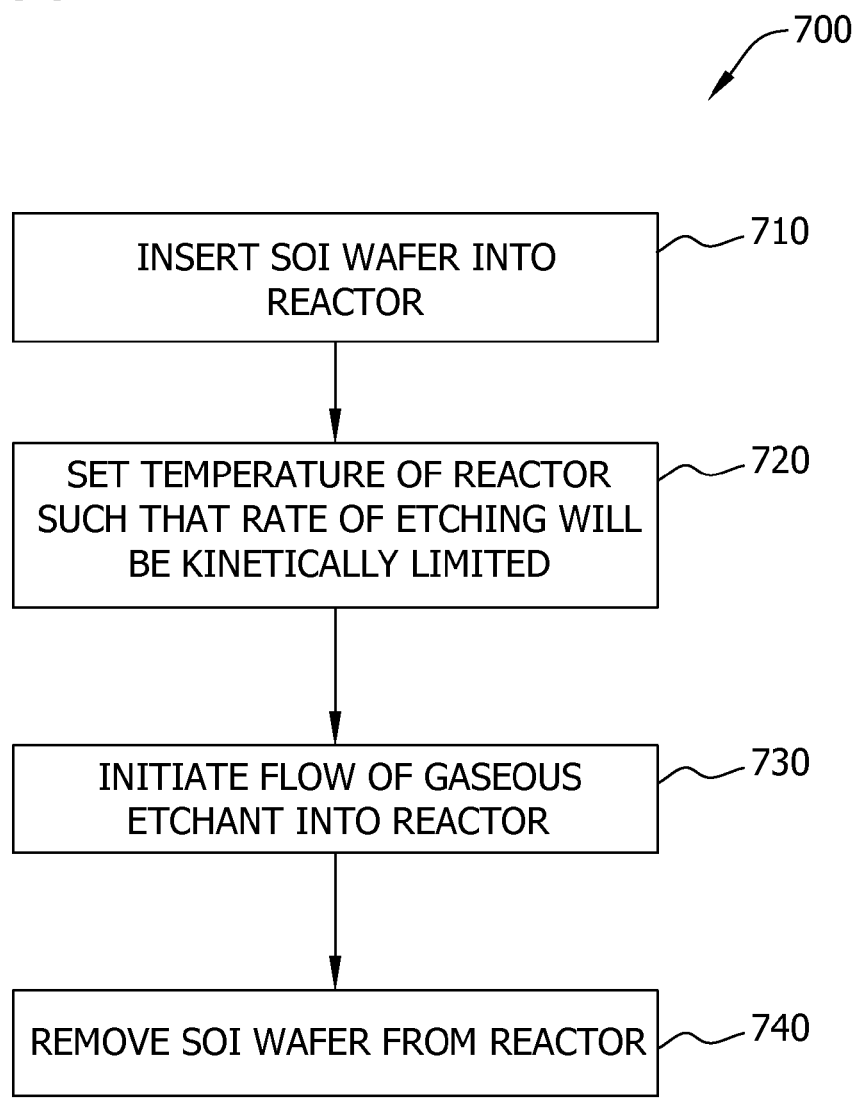
FIG. 7 is a flow diagram showing a method of performing an epitaxial smoothing process on an SOI wafer.

FIG. 7 shows a method 700 for performing an epi-smoothing (i.e., etching) process upon the cleaved surface 152 of the SOI wafer 150. The method 700 begins with the insertion of the SOI wafer 150 into a reactor. The SOI wafer 150 may be inserted into the reactor by any suitable device, such as a robotic manipulator. The reactor may be any suitable epitaxial deposition and/or smoothing reactor suitable for performing the epi-smoothing process upon SOI wafers. The reactor typically has one or more lamps or other mechanisms to heat the interior of the reactor.

The temperature within the reactor is then set in block 720 such that the etching reaction will be kinetically limited, as opposed to being transport limited. As described above, by setting and controlling the temperature such that the epi-smoothing reaction will be kinetically limited results in a more uniform thickness over the cleaved surface 152 of the SOI wafer 150. When the rate of reaction is kinetically limited, the difference in the rate from the center of the SOI wafer 150 to the outer edge is reduced. Instead of increasing at the edges of the SOI wafer 150, the rate of reaction is relatively uniform across the surface of the SOI wafer 150. According to some embodiments, the temperature at which the etching reaction is kinetically limited is between 900° C. and 950° C. Moreover, the reduced temperature corresponding to the kinetic limitation of the rate of deposition also permits colder offset temperatures to be used. In some embodiments, there are three offset zones with independent temperature controllers within the reactor. The three offset zones are the front, side, and rear. To achieve temperature uniformity, the offset zone temperature set points are adjusted with respect to the center zone temperature set point. Accordingly, a lower set point for the center zone results in a lower set point used in the offset zones.

In block 730 the flow of gaseous etchant into the reactor is initiated. According to some embodiments, the flow of gaseous etchant is initiated immediately after the SOI wafer 150 is inserted in the reactor. In these embodiments, the temperature of the reactor is already set at the proper temperature to ensure that the etching reaction will be kinetically limited. The gaseous etchant may be a mixture of HCl or chlorine and $H_2$ according to some embodiments.

The flow of gaseous etchant into the reactor then continues for a period of time. The length of the period of time may be determined based on the amount of silicon that is to be removed from the cleaved surface 152 of the SOI wafer and the rate at which the silicon is being etched. For example, if the rate of etching is 3.0 Angstroms/sec and the amount of silicon to be removed is 900 Angstroms, then the SOI wafer will be removed from the reactor 300 seconds after the flow of gaseous etchant was initiated.

The flow of gaseous etchant is then stopped after the desired amount of silicon has been removed by the flow of gaseous etchant. The SOI wafer 150 is then removed from the reactor. In some embodiments, the SOI wafer 150 may be removed from the reactor by a robotic transport system. In other embodiments, the SOI wafer 150 may remain in the reactor and be subjected to an epi-deposition process in the same reactor, as described below in relation to FIG. 8.

Figure 8:
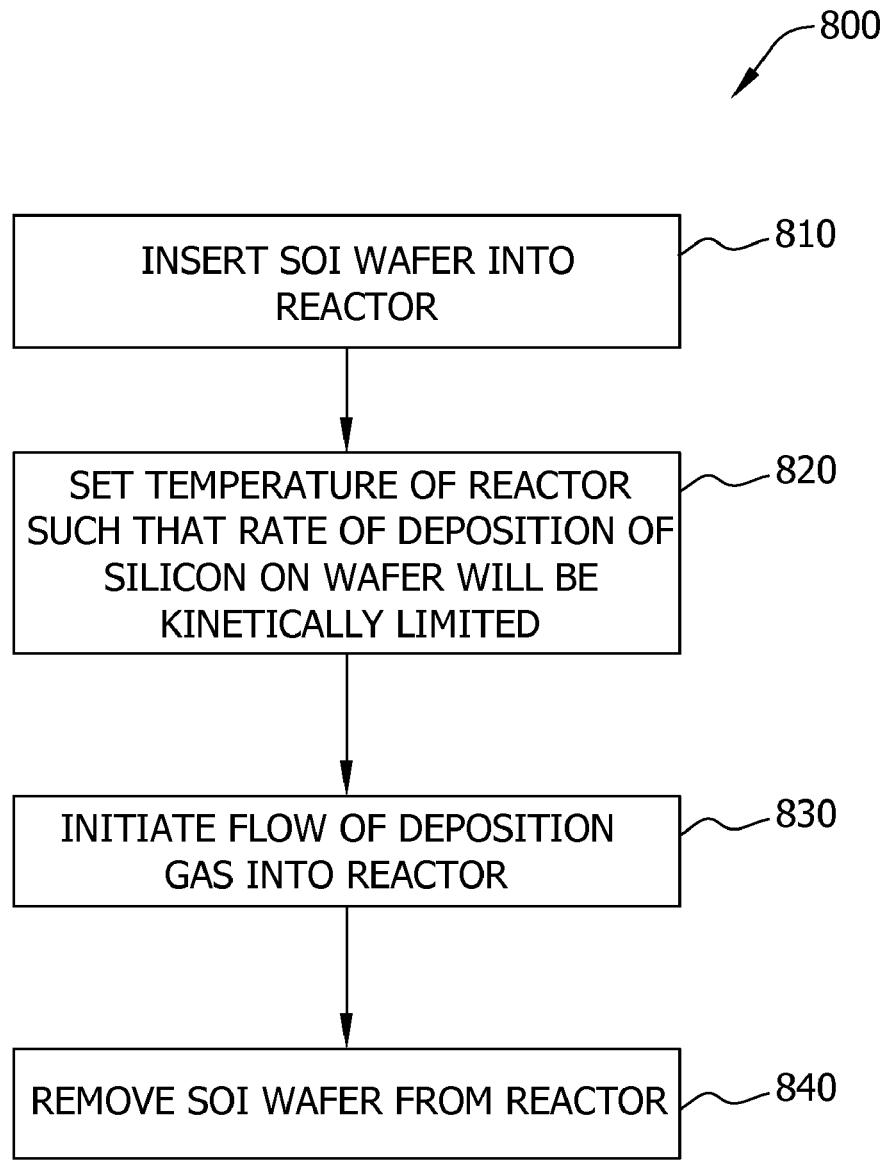
FIG. 8 is a flow diagram showing a method of performing an epitaxial deposition process on an SOI wafer.

FIG. 8 shows a method 800 for performing an epi-deposition process upon the cleaved surface 152 of the SOI wafer 150. The method 800 begins with the insertion of the SOI wafer 150 into a reactor. The SOI wafer 150 may be inserted into the reactor by any suitable device, such as by a robot. The reactor may be of the same type described above in regards to FIG. 7. In some embodiments where the SOI wafer 150 has previously been subjected to an epi-smoothing process, the wafer may already be disposed in the reactor.

The temperature within the reactor is then set in block 820 such that the rate of deposition is kinetically limited, as opposed to being transport limited. As described above, setting and controlling the temperature such that the rate of deposition is kinetically limited results in a more uniform thickness gradient over the cleaved surface 152 of the SOI wafer 150. When the rate of deposition is kinetically limited the difference in the thickness of the deposited layer of silicon from the center of the SOI wafer 150 to the outer edge is reduced. Instead of increasing at edges of the SOI wafer 150, the thickness of the deposited layer is relatively uniform across the surface of the wafer. According to some embodiments using trichlorosilane, the temperature at which the rate of deposition is kinetically limited is between about 950° C. and about 1050° C., or in another embodiment about 1000° C. For other silicon source gas types, the kinetically limited temperature range may be different. For example, for other gases like dichlorosilane or monosilane the kinetically limited growth temperature range is somewhat lower than that for trichlorosilane. Moreover, the reduced temperature corresponding to the kinetic limitation of the rate of deposition also permits colder offset temperatures in the reactor to be used. The colder offset temperatures may be used to effectively control the thickness profile of the cleaved surface 152 near the terrace 160.

In block 830 the flow of deposition gas into the reactor is initiated. The deposition gas may be any of monosilane, dichlorosilane, trichlorosilane, tetrachlorosilane, or any other suitable gas. In some embodiments, the deposition gas may include hydrogen. According to some embodiments, the flow of deposition gas is initiated immediately after the SOI wafer 150 is inserted in the reactor. In these embodiments, the temperature of the reactor is already set at the proper temperature to ensure that the rate of deposition (i.e., growth rate) will be kinetically limited. In addition to reducing and/or eliminating the thickness gradients near the terrace region 160, the decreased temperatures associated with kinetically limiting the rate of deposition also permit the usage of higher flow rates of deposition gases. Moreover, the higher flow rate of deposition gases also result in reduced recirculation flows of the deposition gas due to the reduced Rayleigh number of the deposition gas. The reduced recirculation flow further reduces the amount of silicon deposited on the walls of the reactor by the deposition gas.

The flow of deposition gas into the reactor then continues for a period of time. The length of the period of time may be determined based on the amount of silicon that is to be deposited onto the cleaved surface 152 of the SOI wafer and the rate at which the silicon is being deposited. For example, if the rate of deposition is 220 Angstroms/sec and the amount of silicon to be deposited is 13200 Angstroms (1.32 microns), then the SOI wafer will be removed from the reactor (or the flow of deposition gas ceased) 60 seconds after the flow of deposition gas was initiated.

The flow of deposition gas is then stopped after the desired amount of silicon has been deposited on the cleaved surface 152 of the SOI wafer. The SOI wafer 150 is then removed from the reactor. In some embodiments, the SOI wafer 150 may be removed from the reactor by a robotic transport system.

Figure 9:
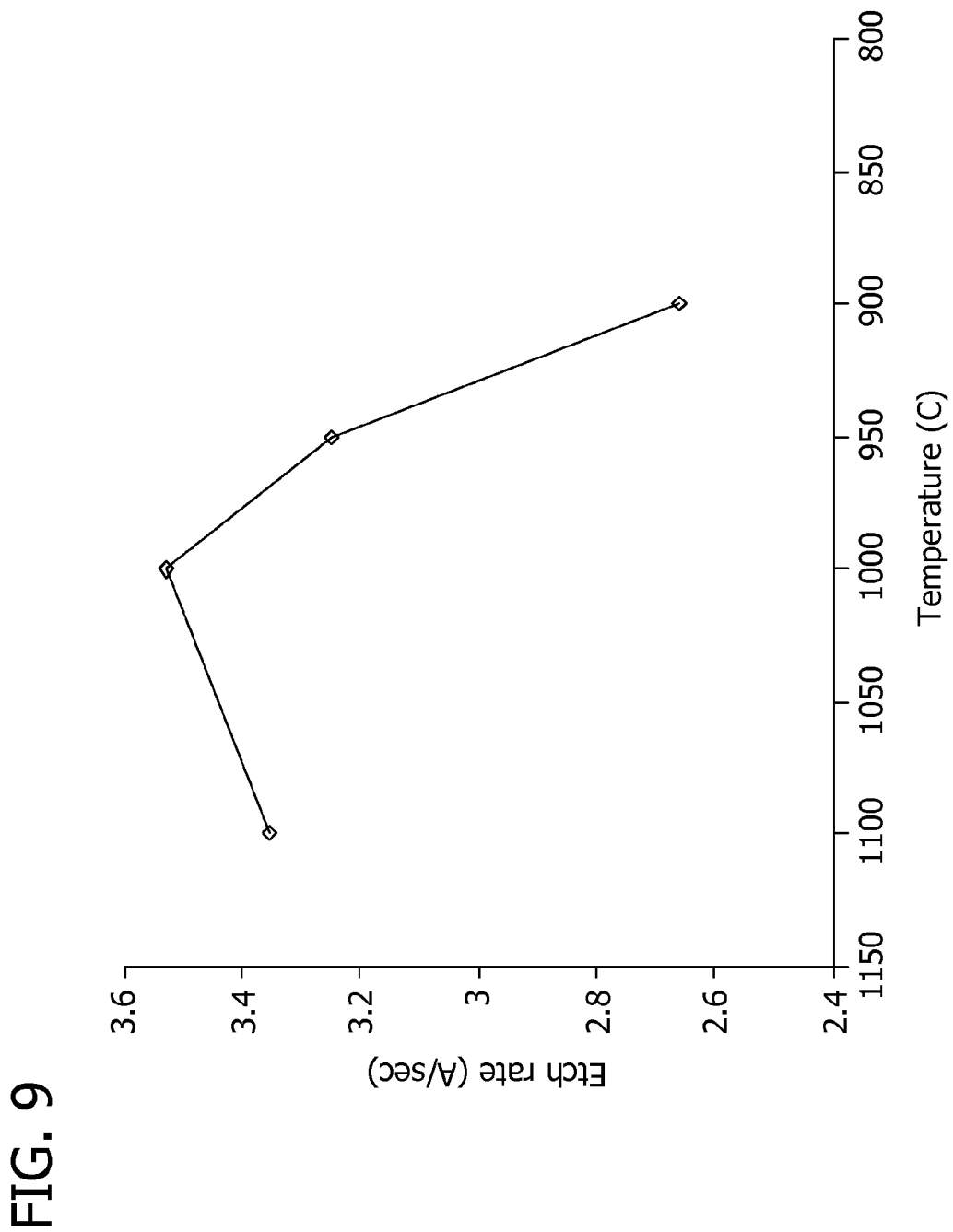
FIG. 9 is a chart showing the relationship between temperature and the rate of etching of the cleaved surface of the bonded wafer.

The chart depicted in FIG. 9 shows the relationship between temperature and the rate of etching of the surface of an SOI wafer. As can be clearly seen in FIG. 9, the rate of etching dramatically decreases as the temperatures decreases below 950° C. It is believed that at or about 950° C. the etching reaction ceases to be transport limited and instead becomes kinetically limited.

Figure 10:
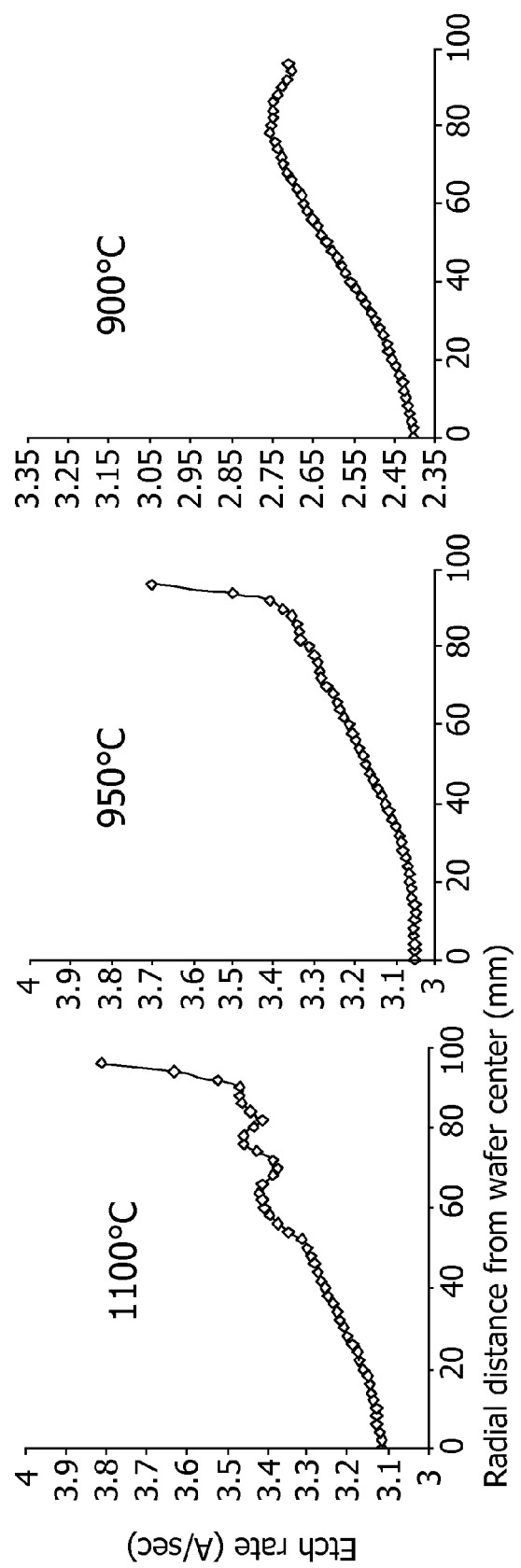
FIGS. 10A-10C are charts showing the relationship between rate of etching of the cleaved surface of the bonded wafer at varying distance from the center of the surface for a different temperatures.

The charts depicted in FIGS. 10A-10C show the relationship between the rate of etching of the surface of an SOI wafer at varying distances from the center of wafer (in this case a 200 mm SOI wafer). FIG. 10A shows the relationship for an epi-smoothing process carried out at 1100° C., while FIG. 10B shows the relationship when carried out at 950° C. and FIG. 10C shows the relationship at 900° C.

As clearly shown in FIGS. 10A and 10B (depicting the relationship in previously used temperatures), the rate of etching during an epi-smoothing process increases towards the edge of a wafer. This increase in the rate of etching results in a corresponding decrease in the thickness of the wafer at or near the edge of the wafer, thus creating a sharp thickness gradient at or near the edge of the wafer. FIG. 10C however shows the relationship between the etching rate and the distance from the center of the wafer according to the methods described above in FIG. 7 where the reaction is kinetically limited, and not transport limited. As can be seen in FIG. 10C, the non-uniformity in the rate of etching near the edges of the wafer is reduced approximately by a factor of four when compared to FIGS. 10A and 10B. In the exemplary embodiment the temperature where the reaction is kinetically limited, and not transport limited, is between approximately 900° C. and 950° C.

Figure 11:
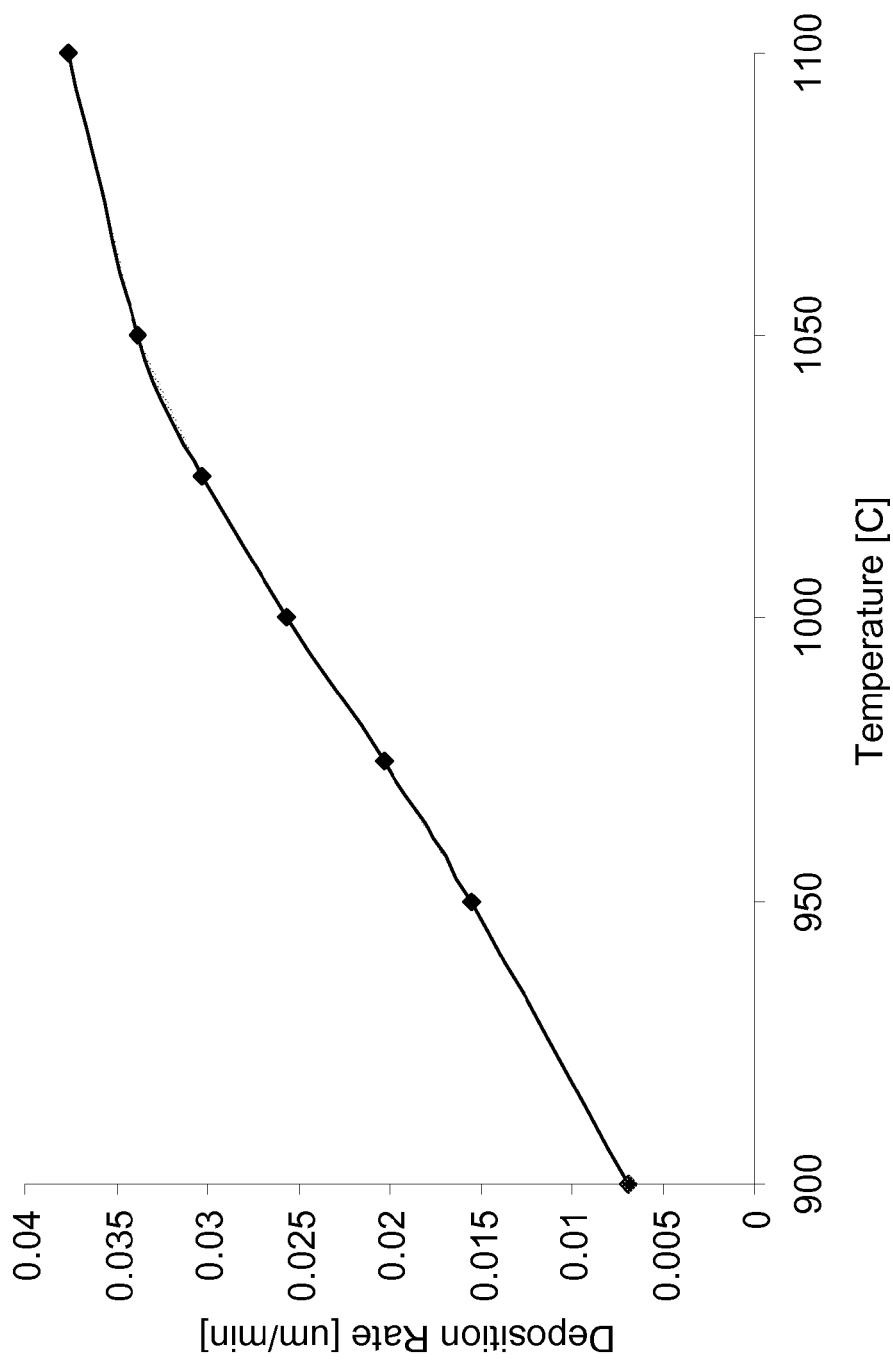
FIG. 11 is a chart showing the relationship between temperature and the rate of deposition of the cleaved surface of the bonded wafer.

The chart depicted in FIG. 11 shows the relationship between temperature and the rate of deposition on the surface of an SOI wafer. As can be clearly seen in FIG. 11, the rate of deposition dramatically decreases as the temperatures decreases below 950° C. It is believed that at or about 950° C. the deposition reaction ceases to be transport limited and instead becomes kinetically limited.

The order of execution or performance of the operations in embodiments of the invention illustrated and described herein is not essential, unless otherwise specified. That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above constructions without departing from the scope of the invention, it is intended that all matter contained in the above description and shown in the accompanying drawings shall be interpreted as illustrative and not in a limiting sense.

What is claimed is:

1. A method for processing a silicon-on-insulator structure comprising a handle wafer, a silicon layer, and a dielectric layer between the handle wafer and the silicon layer, the silicon layer having a cleaved surface defining an outer surface of the structure, the method comprising the steps of:

inserting the structure into a reactor;

etching the cleaved surface while controlling a temperature of the reactor such that the etching reaction is kinetically limited; and depositing an epitaxial layer on the wafer while controlling the temperature of the reactor such that a rate of deposition on the cleaved surface is kinetically limited.

2. The method of claim 1 wherein the temperature of the reactor during etching is between 900° C. and 950° C.

3. The method of claim 1 wherein the temperature of the reactor during depositing is set between 950° C. and 1050° C. when a deposition gas is trichlorosilane.

4. A method for processing a silicon-on-insulator structure comprising a handle wafer, a silicon layer, and a dielectric layer between the handle wafer and the silicon layer, the silicon layer having a cleaved surface defining an outer surface of the structure, the method comprising the steps of:
   inserting the structure into a reactor;
   setting a temperature of the reactor such that a rate of etching of the cleaved surface will be kinetically limited;
   initiating a flow of gaseous etchant into the reactor; and
   etching the cleaved surface.

5. The method of claim 4 wherein the etching step comprises removing at least some of the silicon layer of the structure.

6. The method of claim 4 wherein the gaseous etchant is a mix of hydrogen and hydrogen chloride.

7. The method of claim 4 wherein the temperature of the reactor is set between 900° C. and 950° C.

8. The method of claim 7 wherein the temperature of the reactor is set at 950° C.

9. The method of claim 7 wherein the temperature of the reactor is set at 925° C.

10. The method of claim 4 further comprising stopping the flow of gaseous etchant once a first amount of the silicon layer of the cleaved surface is removed by the gaseous etchant.

11. The method of claim 10 further comprising performing an epitaxial deposition process on the structure after the flow of gaseous etchant has been stopped.

12. A method of processing a silicon-on-insulator structure comprising a handle wafer, a silicon layer, and a dielectric layer between the handle wafer and the silicon layer, the silicon layer having a cleaved surface defining an outer surface of the structure, the method comprising the steps of:
   inserting the structure into a reactor;
   setting a temperature of the reactor such that a rate of deposition of silicon on the cleaved surface will be kinetically limited;
   initiating a flow of deposition gas into the reactor; and
   depositing silicon onto the cleaved surface of the structure.

13. The method of claim 12 wherein the deposition gas contains at least one of: monosilane, dichlorosilane, trichlorosilane, and tetrachlorosilane.

14. The method of claim 12 wherein the depositing step includes depositing silicon contained in the deposition gas onto the cleaved surface of the structure.

15. The method of claim 12 wherein the temperature of the reactor is set between 950° C. and 1050° C. when the deposition gas is trichlorosilane.

16. The method of claim 15 wherein the temperature of the reactor is set at 1000° C.

17. The method of claim 12 further comprising stopping the flow of deposition gas once a first thickness of silicon has been deposited onto the cleaved surface of the structure.

18. The method of claim 12 further comprising removing the structure from the reactor.

* * * * *